United States Patent [19]

Durado

[11] Patent Number: 5,302,120
[45] Date of Patent: Apr. 12, 1994

[54] DOOR ASSEMBLY FOR SEMICONDUCTOR PROCESSOR

[75] Inventor: Daniel L. Durado, Kalispell, Mont.

[73] Assignee: Semitool, Inc., Kalispell, Mont.

[21] Appl. No.: 901,613

[22] Filed: Jun. 15, 1992

[51] Int. Cl.⁵ ............................................. F23M 7/00
[52] U.S. Cl. .................................... 432/250; 432/247; 432/253; 110/173 R
[58] Field of Search ............... 432/250, 247, 242, 237, 432/5, 6, 253; 110/173 R

[56] References Cited

U.S. PATENT DOCUMENTS

| | | | |
|---|---|---|---|
| 4,403,448 | 9/1983 | Lesher | 110/173 R |
| 4,427,378 | 1/1984 | Bowers | 432/250 |
| 4,883,002 | 11/1989 | Schuster | 432/250 |
| 5,193,998 | 3/1993 | Hack et al. | 432/250 |

Primary Examiner—Hency C. Yuen
Attorney, Agent, or Firm—Wells, St. John, Roberts, Gregory & Matkin

[57] ABSTRACT

A door assembly for semiconductor processing equipment used to treat semiconductor substrates, wafers, photomasks, data disks, and other units. The door assembly is mounted to the front wall of a semiconductor processor enclosure having an access opening by means of a pair of guide rods and corresponding sliding bushings connected to the door which encircle the rods to allow movement of the door along the guide rods. A magnetic rodless piston mounted in an actuator bushing block which is magnetically coupled to an actuator bushing block moves the door assembly along the guide rods. The door assembly telescopically moves toward and away from the access opening to allow units to be installed into and removed from the enclosure, and to close the access opening. A window including an expandable seal is secured to an extension piece of the telescoping door assembly to seal between the door assembly and the access opening.

44 Claims, 6 Drawing Sheets

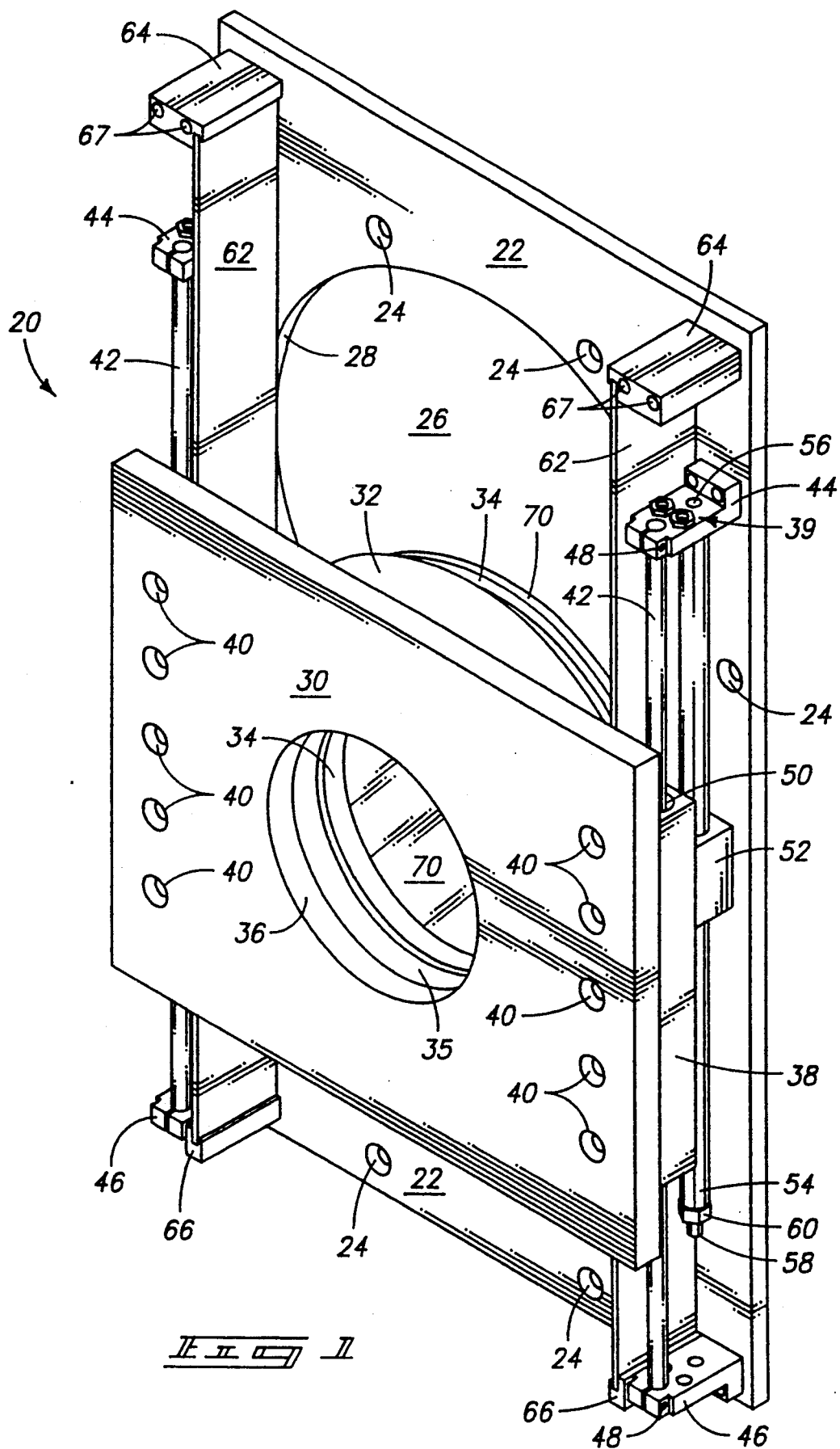

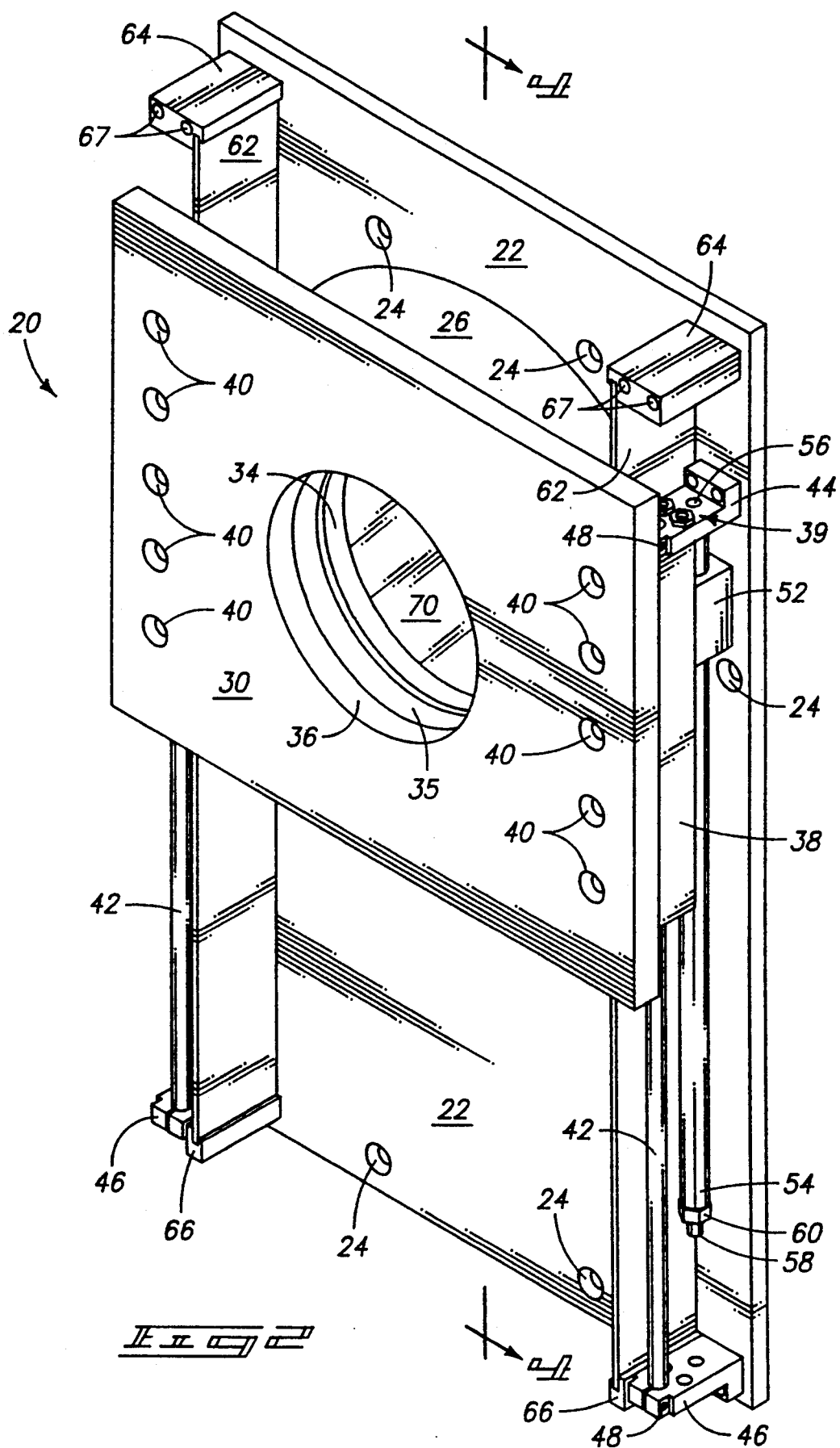

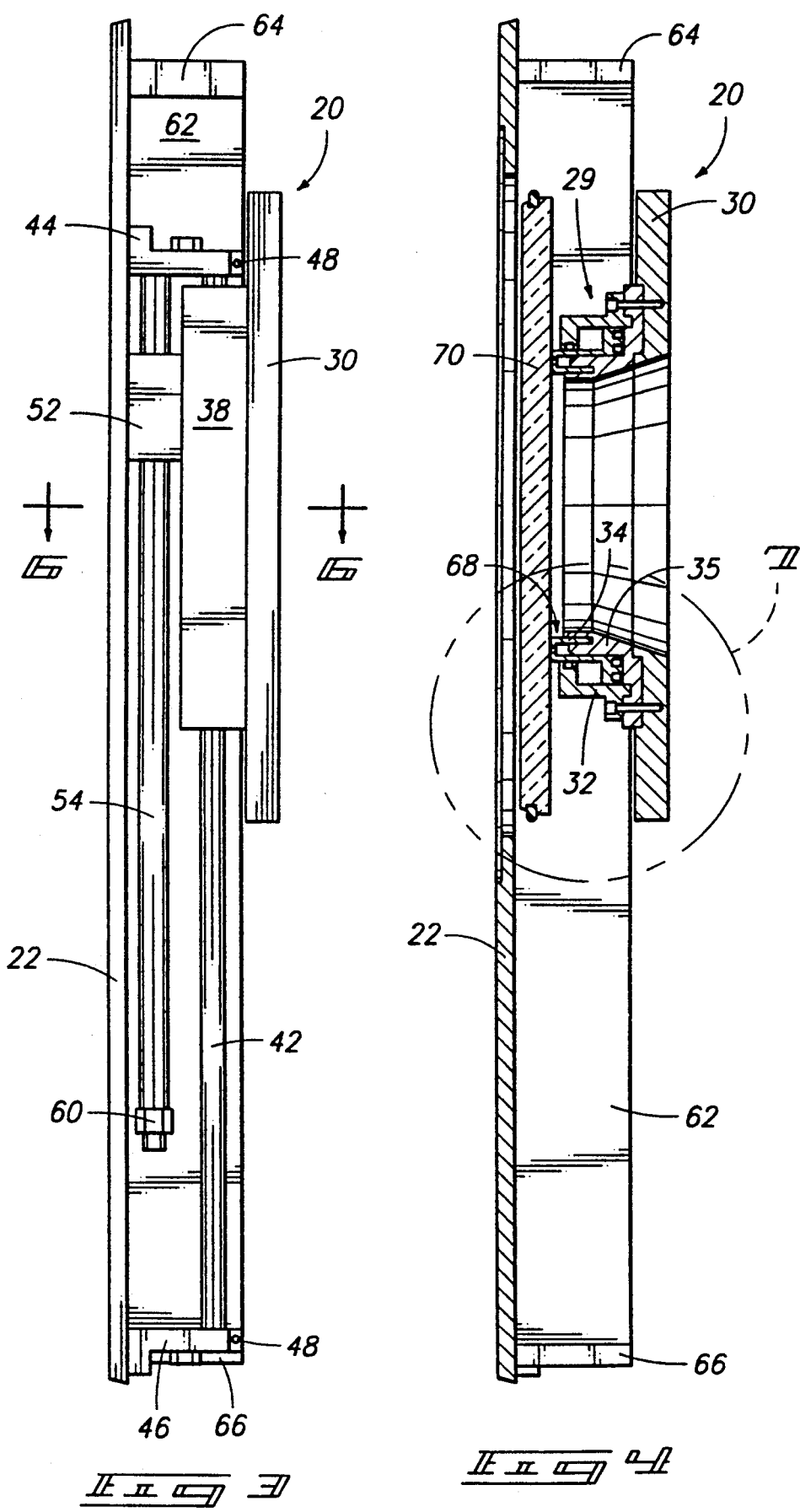

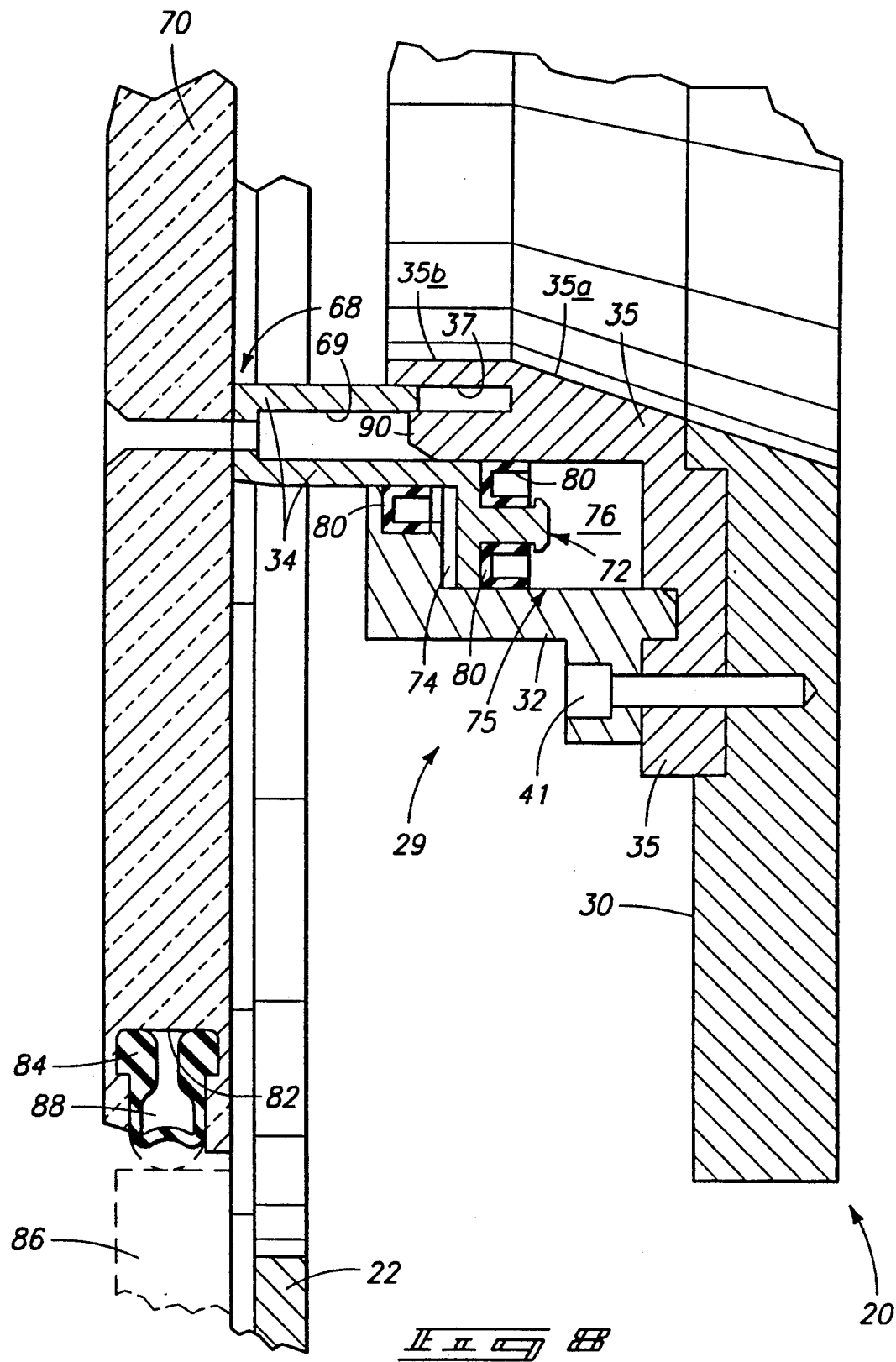

DOOR ASSEMBLY FOR SEMICONDUCTOR PROCESSOR

TECHNICAL FIELD

The technical field of this invention relates to semiconductor processing equipment used to treat semiconductor substrates, wafers, photomasks, data disks, and other units.

BACKGROUND OF THE INVENTION

The production of semiconductor substrates, wafers and photomasks has traditionally used processing equipment in which various types of processing fluids are used. One example of a semiconductor processor is a rinser-dryer which uses water and dilute cleaning solutions. Other processors use acids, caustics, etchants, solvents and other processing fluids which are applied to the substrates, wafers, photomasks, data disks, and other semiconductor-related units.

A constant challenge in the production of semiconductors is particle contamination. With respect to all types of semiconductor processors, preventing contaminant particles from entering into the processor enclosure is of paramount importance. Such particles can affect the photographic processes used to transfer the chip layouts onto the wafers being processed into chips, and can further cause deterioration of the image being transferred onto the wafer. Even more susceptible to contamination is the direct processing of the wafers because of the numerous processing steps that take place. With each step there is a risk that contaminating particles may adhere to the surface of the wafer. Once contaminant particles are transferred onto the surface of the wafer, they are often difficult to remove.

One of the greatest sources of contaminating particles is the presence of environmental dust carried in the air surrounding the semiconductor processors. To reduce the amount of environmental contamination, manufacturers have taken extreme measures to provide working areas with relatively low amounts of environmental dust. These areas are called "clean rooms". Such working areas are expensive to build and operate. Hence, there is a substantial need to provide semiconductor processing equipment that minimizes the risk of contamination.

Another problem associated with traditional semiconductor processors relates to toxic and corrosive processing fluids, such as acids, caustics, solvents and other processing fluids. Such processing fluids must be maintained within the processing chamber to avoid corrosion and other harmful effects to personnel and materials outside of the semiconductor processor enclosure. Of concern are both liquid and gaseous forms of processing fluids, both of which should be prevented from exiting the processor enclosure and contacting machine parts susceptible to corrosion. This is true both during processing and when access into the processing chamber is needed. Thus, there exists a need to provide semiconductor processing equipment that adequately seals processing fluids inside the processing chamber during manufacturing and prevents them from escaping and causing damage.

Various attempts have been made to provide doors for semiconductor processing equipment that will adequately seal the access opening to prevent contaminant particles from entering and prevent processing fluids and vapors from escaping. However, because of the need to precisely align the door with the enclosure access opening, traditional equipment has required substantial in-field adjustments to ensure that the door seats properly within the access opening. This has involved substantial amounts of time and labor. Further, because of the many mechanical working parts required for the adjustments, the risk of mechanical failure of the doors has been high. Accordingly, there is a need to provide an effective door for semiconductor processors which has relatively few adjustable parts and is relatively easy to install and service in the field.

There remains a substantial need for semiconductor processing equipment which is easy to install and service in the field and minimally susceptible to mechanical failure. The present invention provides substantial and surprising benefits with respect to these needs.

BRIEF DESCRIPTION OF THE DRAWINGS

One or more preferred forms of the invention are described herein with reference to the accompanying drawings. The drawings are briefly described below.

FIG. 1 is a front isometric view of a preferred semiconductor processor door assembly made according to the present invention.

FIG. 2 is another front isometric view of the semiconductor processor door assembly of FIG. 1, which shows a portion of the door assembly covering the access opening of the processor.

FIG. 3 is a left side elevational view of the processor door assembly as positioned in FIG. 2.

FIG. 4 is a sectional view, taken along line 4—4 of FIG. 2 with the door retracted outward from the access opening.

FIG. 8 is an enlarged partial sectional view of the processor door assembly, similar to FIG. 7, showing the door in an extended position.

DETAILED DESCRIPTION OF THE PREFERRED EMBODIMENTS

Figure 5:
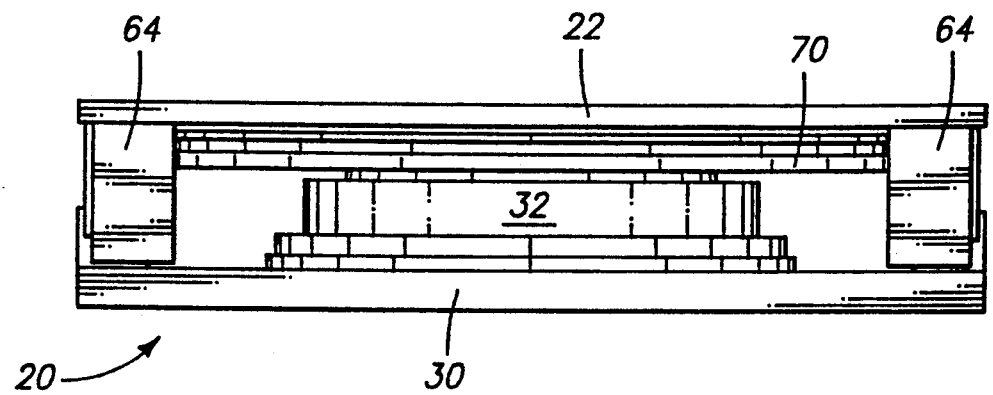
FIG. 5 is a top view of the processor door assembly of FIG. 2.
Figure 6:
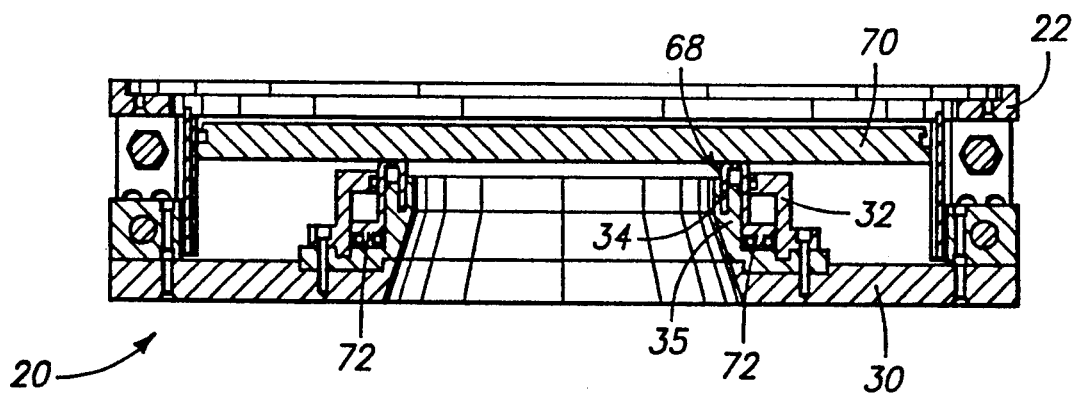
FIG. 6 is a sectional view taken along the line 6—6 of FIG. 3.

This disclosure of the invention is submitted in furtherance of the constitutional purposes of the U.S. Patent Laws "to promote the progress of science and useful arts" (Article 1, Section 8).

As shown in FIGS. 1-6, the present invention involves a door assembly 20 adapted to be used in a semiconductor processor (not otherwise illustrated). The semiconductor processor is most preferably a centrifugal machine, either a rinser-dryer, solvent processor, acid processor or others. Such a semiconductor processor is capable of processing one or more semiconductor substrates, wafers, photomasks, data disks, and other semiconductor-related units which are sensitive to contamination from even very small particles; e.g., equal to or larger than 0.1-0.2 micron. Some of the materials which can be processed in a typical semiconductor processor include silicon units, gallium arsenide units, indium phosphide units, glass units, ceramic units, solar cells, memory disks, flat panel displays, and other semiconductor-related units. A variety of processing fluids are used in various processing steps include various types of acids, caustics, etchants, solvents and other rinsing and processing solutions.

With reference to FIGS. 1 and 2, the door assembly 20 is secured to a front wall 22 of a semiconductor processor enclosure. The front wall is adapted to be secured to the remaining structure of the processor by using traditional fasteners at mounting locations 24 located about the periphery of the front wall 22. The front wall 22 includes an access opening 26 defined by a circular opening periphery 28 of the front wall. When the front wall 22 is mounted to remaining portions of the processor, the opening periphery 28 will be positioned to be in alignment with an access port or opening formed in the front wall of the processor bowl (not shown).

The door assembly 20 further includes a door support in the form of a door support plate 30. Door support 30 mounts a door 70 and a door extension and retraction operator 29. The door extension and retraction operator includes a main part 32 coupled to the door support plate, and an operative extension part 34. The operative part 34 is positioned inside of the main part for controllable extension and retraction relative to the main part. The main piece is fixedly coupled to the door support plate 30 and provides a base for supporting the movable extension piece. The extension piece is concentrically and telescopically positioned within the main piece for relative movement thereto. Additional features and the operation of the extension piece and main piece are discussed in greater detail below.

FIGS. 1 and 2 show the door support plate 30 has a viewing aperture 36 for providing visibility through the door into the processing chamber contained within the bowl of the processor. The door support plate 30 is coupled on each side to slidable guide follower in the form of a sliding bushing 38 at mounting points 40 using conventional fasteners.

As shown in FIGS. 1-6, a pair of guide rods 42 are connected to the front wall 22 of the enclosure, each by a top mounting bracket 44 and at the bottom by a bottom mounting bracket 46. The mounting brackets 44, 46 securely hold the guide rods in place by means of pinch bolts 48.

Each sliding bushing 38 encircles a guide rod 42 to maintain the door assembly 20 in a properly aligned plane relative to the front wall 22 of the processor enclosure. The sliding bushing 38 includes an inner cylindrical cavity 50 sized to slidably receive the guide rods 42 to allow movement along the rod 42. A pair of guide rod adjustment assemblies 39 allows minor adjustments to the position of each guide rod relative to the front wall 22. In a preferred embodiment, the parallel relationship and vertical orientation of the guide rods 42 allow for vertical movement of the movable door subassembly formed by door support 30, operator 29, door 70, slides 38, and the vertical operators 52. the subassembly is capable of vertical movement between an open or fully displaced position to allow access into the bowl of the processor enclosure (FIG. 1), and an aligned position whereby the door assembly 20 is in substantially concentric alignment with the access opening 26. In the aligned position the door can be extended into the access opening 26 and sealed against the bowl of the processor.

The door assembly 20 also includes a vertical operator or actuator 52. Vertical operator 52 is rigidly coupled, such as by conventional fasteners (not shown), to the sliding bushing 38. Each vertical operator 52 encircles an actuator tube 54 and is controllably moved relative thereto. The actuator block 52 houses a permanent magnet (not shown) which is utilized for moving the sliding bushing 38 and connected door support plate 30 along guide rods 42. This is accomplished by providing within each actuator tube 54 a magnetic piston (not shown) which is controllably movable therewithin. The actuator block 52 is attracted to the magnetic piston. Because of the attractive magnetic forces, the actuator block 52 follows the magnetic piston and they remain in the same relative position. The magnetic piston is moved along the inside of actuator 54 by increasing or decreasing fluid pressure into the actuator tubes 54 via an upper inlet end 56 or a lower inlet end 58. Each end is advantageously provided with a barb fitting 60 for readily coupling a pneumatic line to provide increased or decreased fluid pressure at the ends of the tube 54. Upon creating a differential pressure on the sides of the piston, the combination of the piston and the bushing block 52 will move up or down along the guide rods 42 to move the door assembly 20 along guide rods 42 relative to the access opening 26.

Still referring to FIGS. 1 and 2, the door assembly 20 also advantageously includes shield members 62 coupled to the front wall 22 of the semiconductor processor. Shield members 62 are held by upper mounting brackets 64 and lower mounting brackets 66. The upper brackets are secured to the front wall 22 by means of conventional fasteners 67. Similarly lower mounting brackets are secured to the wall 22 by conventional fasteners (not shown).

As shown in FIGS. 3 and 4, the shield members 62 provide a barrier between the access opening 26 and guide rods 42, actuator tube 54, and other parts of the door assembly 20. The shields may be made of any suitable material, such as polypropylene or the like, which is resistant to corrosion from the acids, caustics, etchants, and other corrosive materials that may be utilized as processing fluids within the processing chamber. The shield members 62 serve to prevent corrosive fumes from migrating laterally upon opening of the processor door. This prevents the fumes from contacting corrosion-susceptible parts of the door assembly 20.

Referring now to FIGS. 4, 6, 7, and 8, which show sectional views of the door assembly 20, the movement of the extension piece 34 relative to the main piece will be explained in greater detail. As explained above, the door support plate 30 provides the primary mounting base for the axially extendable portions of the door assembly 20.

Figure 7:
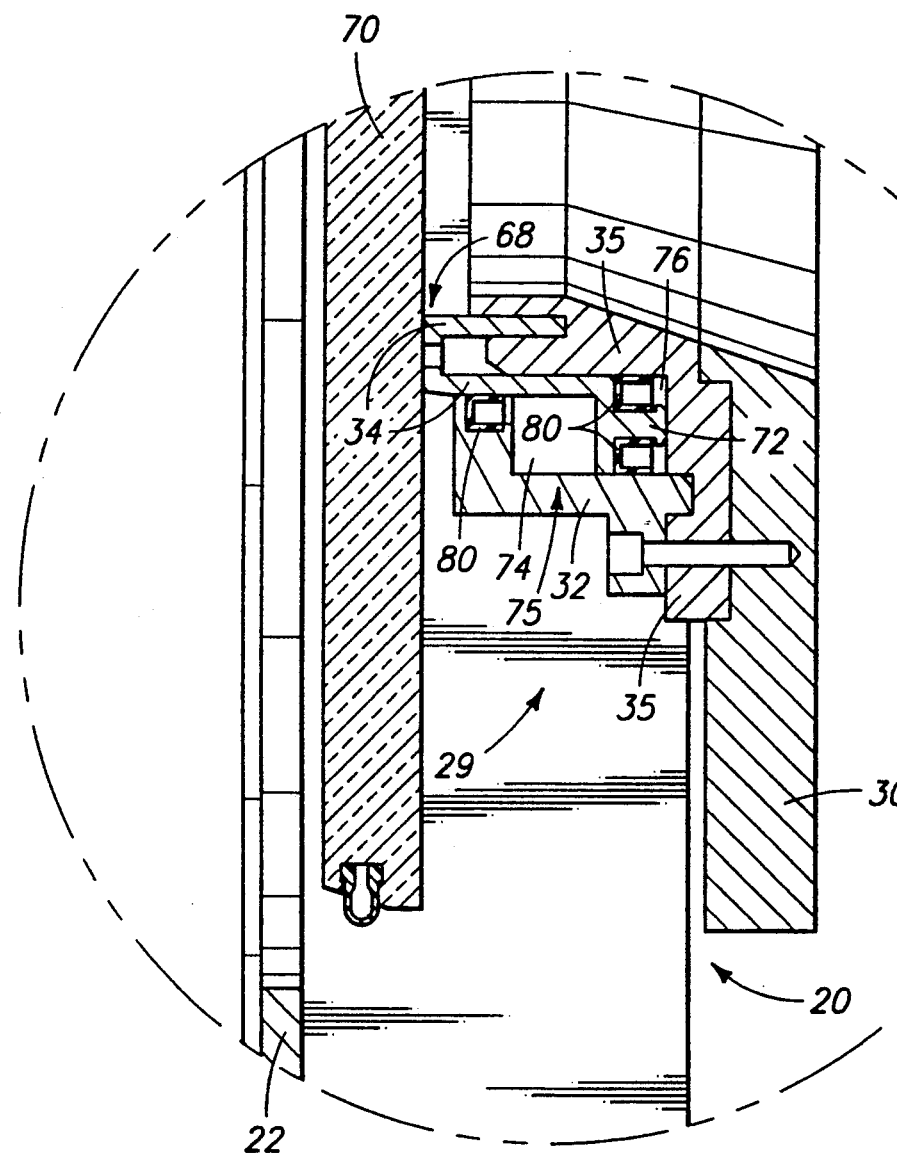
FIG. 7 is an enlarged partial sectional view, taken from area 7 of FIG. 4, of the processor door assembly showing the door in a retracted position.

Referring to the enlarged sectional views of FIGS. 7 and 8, an annular inner stationary piece 35 is securely mounted upon the door support piece 30. At the point of mounting, the inner stationary piece 35 is bounded on one side by the door support piece 30 and on an opposite side by the annular main piece 32. A plurality of conventional fasteners 41 (only one shown) secure the inner stationary piece 35 and the main piece 32 to the door support piece 30. The inner piece 35 includes a sloping, annularly circular inside surface 35a which conically narrows the viewing area through the door assembly and terminates in a substantially cylindrical view aperture 35b.

The door assembly 20 includes an axial extension retraction operator 29. The door 70 is extendible into the access opening 26 using such operator. The operator further includes an annular extension part 34. The sectional view in FIG. 8 indicates that the extension part 34 has an annular guide receptacle 69. In the sectional view of FIG. 8 the annular guide receptacle is formed by a U-shaped portion 68. An annular tongue 90 is formed by portions of the stationary inner part 35 as defined outwardly from annular guide slot 37. Part 34 also includes an annular piston portion 72. Piston portion 72 is formed as a flange which extends outwardly from annular tongue 90. The annular piston portion 72 rides within an annular piston operation chamber 75 defined by the inner stationary piece 35 and the main piece 32. The inward annular fin opposite piston 72 rides in the annular slot 37 and acts like a shield. A door 70 is attached to the face or apex of the U-shaped portion 68 by conventional fasteners or adhesives. The door can be made transparent to thus provide a window which allows an operator of the semiconductor processor to monitor processing within the processor bowl (not shown).

The piston 72 bifurcates the annular piston operation chamber 75 into two compartments: a retraction chamber compartment 74 and an extension chamber compartment 76. Each piston chamber compartment is adapted to hold pneumatic or hydraulic fluid. Multiple annular seals 80 are positioned about the piston portion 72 and the extension piece 34 to seal separate fluid within chambers 74 and 76.

Separate fluid supply conduits (not shown) are provided to retraction chamber 74 and extension chamber 76 to increase or decrease fluid pressure within the respective chambers and effectuate movement of the piston. For example, when hydraulic fluid is supplied under an increased pressure to the extension chamber 76, a pressure differential is create on the piston 72 which will cause the extension piece 34 to extend away from the door support plate 30. A primary advantage of the present invention is that the piston 72 causes the extension piece 34 to move outwardly from the plate 30 equidistantly at all times and requires no peripheral adjustments to ensure equidistant movement.

FIG. 8 shows the extension member 34 and integral piston piece 72 in an extended position. This position occurs when fluid pressure increases in extension chamber 76. FIG. 8 shows the window-door 70 extended into closed position relative to the access opening 85 formed in the front wall 86 of the semiconductor processor bowl. A slot 82 is provided in the periphery of the window-door 70. Slot 82 receives an expandable, annular seal 84. When the window 70 is in a fully extended position, it lies in a plane which is within or adjacent to the exterior wall 86 of the processor bowl. The seal 84 has an inner cavity 88 which allows the seal to be controllably expanded (shown in phantom) upon introduction of a pressurized fluid into the cavity 88. This effectuates a seal between the window 70 and the processor bowl 86.

The door system is constructed using known machining and forming techniques to produce the components and assemblies described and shown herein. The specific materials of construction vary dependent upon the type of chemicals used in the processor.

In operation, the door assembly 20 is moved into an closed position by actuating the magnetic actuator bushing block 52 and forcing the door assembly 20 upward along the guide rods 42 until the door assembly is in concentric alignment with the access opening 26. The piston 72 then urges the extension piece away from the door support plate 30 and into the access opening 26. Finally, pressurized fluid is introduced into inner cavity 88 of the seal 84 to seal the enclosure. These steps are reversed to move the door assembly 20 into an open position whereby units can be installed into and removed from the processor enclosure.

In compliance with the statute, the invention has been described in language necessarily limited in its ability to properly convey the conceptual nature of the invention. Because of this inherent limitation of language, it must be understood that the invention is not necessarily limited to the specific features described, since the means herein disclosed comprise merely preferred forms of putting the invention into effect. The invention is, therefore, claimed in any of its forms or modifications within the proper scope of the appended claims appropriately interpreted in accordance with the doctrine of equivalents.

I claim:

1. A semiconductor processor for processing semiconductor substrates, wafers, photomasks, data disks, and other units, comprising:
    a frame;
    a processing enclosure connected to the frame for receiving one or more units therein for processing; said enclosure having an access opening through which units are installed into and removed from the enclosure; said access opening being at least partially defined by an opening periphery;
    a door support connected to the frame; said door support including at least one guide;
    a door assembly mounted upon said guide; the door assembly including a main piece and an extension piece concentrically aligned with said main piece; said extension piece being axially movable relative to the main piece for controllable extension or retraction relative thereto;
    an extension piece actuator for actuating the extension piece into extended and retracted positions; said extension piece actuator including an annular piston;
    a seal for sealing between the extension piece and the opening periphery of the access opening; said seal being expandable.

2. A semiconductor processor according to claim 1 wherein the actuator includes a circularly annular piston; said piston extending integrally from the extension piece and being received within an annular chamber.

3. A semiconductor processor according to claim 1 and further comprising at least one shield connected to the processing enclosure adjacent the access opening for shielding the guide against fumes escaping from the access opening when the door is in an open position.

4. A semiconductor processor according to claim 1 and further comprising at least one window coupled to the extension piece for viewing inside said processing enclosure.

5. A semiconductor processor for processing semiconductor substrates, wafers, photomasks, data disks, and other units, comprising:
    a frame;
    a processing enclosure connected to the frame for receiving one or more units therein for processing; said enclosure having an access opening through which units are installed into and removed from the enclosure; said access opening being at least partially defined by an opening periphery;
    a door support connected to the frame; the door support including at least one guide connected to the frame;

a door assembly mounted upon the door support; the door assembly including a main piece and an extension piece; said extension piece being movable relative to the main piece for controllable extension or retraction relative thereto; the door being translatable along the guide for movement between fully displaced positions and aligned positions relative to the access opening;

an extension piece actuator for actuating the extension piece into extended and retracted positions.

6. A semiconductor processor according to claim 5 wherein the extension piece actuator is a pneumatic actuator.

7. A semiconductor processor according to claim 5 and further comprising a seal for sealing between the extension piece and the opening periphery of the access opening.

8. A semiconductor processor according to claim 5 wherein the extension piece actuator includes a piston.

9. A semiconductor processor according to claim 5 wherein the extension piece actuator includes an annular piston.

10. A semiconductor processor according to claim 5 wherein the extension piece actuator includes a circularly annular piston.

11. A semiconductor processor according to claim 8 wherein the piston is annularly shaped and extends integrally from the extension piece and is received within an annular chamber.

12. A semiconductor processor according to claim 5 and further comprising a seal for sealing between the extension piece and the opening periphery of the access opening; wherein the seal comprises a resilient, expandable seal.

13. A semiconductor processor unit according to claim 12 and further comprising means for controllably expanding the seal.

14. A semiconductor processor according to claim 12 wherein the seal includes an inner cavity such that introduction of a medium under pressure into the inner cavity causes the seal to expand.

15. A semiconductor processor according to claim 5 wherein the door support includes a plurality of guides connected to the frame; the door being translatable along the guides for movement between fully displaced positions and aligned positions relative to the access opening.

16. A semiconductor processor according to claim 5 and further comprising an actuator for translationally moving the door along the guide relative to the access opening.

17. A semiconductor processor according to claim 5 and further comprising a magnetic actuator for translationally moving the door along the guide relative to the access opening.

18. A semiconductor processor according to claim 5 and further comprising a magnetic actuator for translationally moving the door along the guide relative to the access opening; the magnetic actuator including a first magnet mounted upon said guide and a second magnet fixed to said support.

19. A semiconductor processor according to claim 5 and further comprising at least one shield connected to the processing enclosure adjacent the access opening.

20. A semiconductor processor according to claim 5 and further comprising at least one shield connected to the processing enclosure adjacent the access opening for shielding the guide against fumes passing from the access opening when the door is in an open position.

21. A semiconductor processor according to claim 5 wherein said door includes at least some transparent portions to provide a window for viewing inside said processing enclosure.

22. A semiconductor processor according to claim 5 and further comprising a window mounted to the extension piece of the door assembly for viewing inside said processing enclosure.

23. A semiconductor processor for processing semiconductor substrates, wafers, photomasks, data disks, and other units, comprising:

a frame;

a processing enclosure connected to the frame and having an access opening through which units are installed into and removed from the enclosure;

a door support connected to the frame; the door support including at least one guide;

a door assembly slidably mounted upon the guide to enable linear translational movement of the door relative to the frame; the door assembly including a main portion and an extension portion; the extension portion being concentrically aligned with the main portion; the extension portion being complimentary in size to the access opening and axially movable relative to the main portion to extend into and retract from within the access opening;

an annular piston connected to the extension portion and being received within a complimentary annular chamber of the main portion;

a pneumatic actuator operatively coupled to the annular piston to move the piston axially between open positions and closed positions.

24. A semiconductor processor according to claim 23 and further comprising an expandable seal.

25. A semiconductor processor according to claim 23 and further comprising a resilient, expandable seal and means for expanding the seal.

26. A semiconductor processor according to claim 23 and further comprising a seal having an inner cavity such that introduction of a medium under pressure into the inner cavity causes the seal to expand.

27. A semiconductor processor according to claim 23 and further comprising at least one shield connected to the processing enclosure adjacent the access opening.

28. A semiconductor processor according to claim 23 and further comprising at least one window coupled to the extension piece for viewing inside said processing enclosure.

29. A semiconductor processor for processing semiconductor substrates, wafers, photomasks, data disks, and other units, comprising:

a frame;

a processing enclosure connected to the frame and having an access opening through which units are installed into and removed from the enclosure;

a door support connected to the frame;

a door assembly mounted upon the door support, the door assembly including an extension member and a base member; said extension member being positioned in concentric alignment with said base member and being axially movable relative thereto between extended and retracted positions;

an annular piston connected to the extension member and being received within a complimentary annular chamber of the main portion;

a pneumatic actuator operatively coupled to the annular piston to move the piston axially between open retracted positions and closed extended positions.

30. A semiconductor processor according to claim 29 and further comprising an expandable seal.

31. A semiconductor processor according to claim 29 and further comprising a resilient, expandable seal and means for expanding the seal.

32. A semiconductor processor according to claim 29 and further comprising a seal having an inner cavity such that introduction of a medium under pressure into the inner cavity causes the seal to expand.

33. A semiconductor processor according to claim 29 and further comprising at least one shield connected to the processing enclosure adjacent the access opening for shielding the door support against fumes passing from the access opening when the door is in an open position.

34. A semiconductor processor according to claim 29 wherein the extension portion is extendable into the access opening of the processing enclosure.

35. A semiconductor processor according to claim 29 wherein the piston is a circularly annular piston.

36. A semiconductor processor according to claim 29 and further comprising at least one window coupled to the extension piece for viewing inside said processing enclosure.

37. A door assembly adapted for use in a semiconductor processor for processing semiconductor substrates, wafers, photomasks, data disks, and other units, comprising:

at least one guide adapted to be connected to a processing enclosure having an access opening;

a door assembly mounted upon said guide including an extension member and a base member; said extension member being positioned in concentric alignment with said base member and being axially movable relative thereto between extended and retracted positions; said door assembly being movable along said guide between aligned and displaced positions;

an annular piston operatively coupled to door assembly for moving the extension member between open retracted positions and closed extended positions.

38. A door assembly according to claim 34 and further comprising a window connected to the door assembly.

39. A door assembly according to claim 34 wherein the piston is a circularly annular piston.

40. A door assembly according to claim 34 wherein the annular piston extends integrally from the extension member; said piston being received within an annular chamber.

41. A door assembly according to claim 34 and further comprising a seal coupled to the door assembly.

42. A door assembly according to claim 34 and further comprising an expandable seal.

43. A door assembly according to claim 34 and further comprising an expandable seal coupled to the periphery of the extension piece.

44. A door assembly according to claim 34 and further comprising at least one shield positioned between the access opening and the guide.

* * * * *